US010793950B1

(12) United States Patent
Reineke (10) Patent No.: US 10,793,950 B1
(45) Date of Patent: Oct. 6, 2020

(54) CVI/CVD PREFORM SEPARATOR

(71) Applicant: Leland M. Reineke, Midland, MI (US)

(72) Inventor: Leland M. Reineke, Midland, MI (US)

( * ) Notice: Subject to any disclaimer, the term of this patent is extended or adjusted under 35 U.S.C. 154(b) by 213 days.

(21) Appl. No.: 15/384,409

(22) Filed: Dec. 20, 2016

Related U.S. Application Data (60) Provisional application No. 62/387,437, filed on Dec. 23, 2015.

(51) Int. Cl.
| | | |
|---|---|---|
| *B32B 3/26* | (2006.01) | |
| *B32B 7/12* | (2006.01) | |
| *B32B 5/00* | (2006.01) | |
| *B32B 5/02* | (2006.01) | |
| *B32B 37/12* | (2006.01) | |
| *C23C 16/458* | (2006.01) | |
| *C23C 16/455* | (2006.01) | |

(52) U.S. Cl.
CPC ........ *C23C 16/4581* (2013.01); *C23C 16/455* (2013.01)

(58) Field of Classification Search
CPC .. B32B 3/26; B32B 7/12; B32B 37/12; B32B 5/02; C23C 16/4581; C23C 16/4582; C23C 16/4583; Y10T 428/24612; Y10T 428/218; Y10T 428/24273; Y10T 428/24314
See application file for complete search history.

(56) References Cited

U.S. PATENT DOCUMENTS

| | | | | |
|---|---|---|---|---|
| 4,396,663 A | * | 8/1983 | Mitchell | C04B 35/806 156/155 |
| 5,871,844 A | * | 2/1999 | Theys | C04B 35/83 428/367 |
| 6,284,969 B1 | * | 9/2001 | Fraas | H02S 10/30 136/253 |
| 2004/0017019 A1 | * | 1/2004 | Huang | C04B 35/521 264/29.5 |
| 2015/0315430 A1 | * | 11/2015 | Nguyen | C08J 5/24 523/466 |

\* cited by examiner

*Primary Examiner* — Joanna Pleszczynska
(74) *Attorney, Agent, or Firm* — Ralph E. Jocke; Walker & Jocke (57) ABSTRACT

Preform separators are operative to separate porous preforms that undergo chemical vapor integration and deposition (CVI/CVD) to form components such as carbon-carbon composite disc brake rotors. The exemplary preform separators are comprised of thin sheets of organic fibers separated by layers containing adhesives and other materials. Bodies comprised of the plurality of thin sheets and layers undergo carbonization at a controlled rate in a non-oxidizing atmosphere. The preform separators have flat planar opposed side faces which abut porous preforms during the CVI/CVD process. Exemplary separators include channels that facilitate the infiltration of carbon carrying gas into the preforms to aid in densification. The preform separators are reusable in a plurality of densification cycles and have non-stick properties.

27 Claims, 7 Drawing Sheets

CVI/CVD PREFORM SEPARATOR

CROSS REFERENCE TO RELATED APPLICATION

This application claims benefit pursuant to 35 U.S.C. § 119(e) of U.S. Provisional Application 62/387,437 filed Dec. 23, 2015, the disclosure of which is incorporated herein by reference in its entirety.

TECHNICAL FIELD

Exemplary embodiments relate to chemical vapor infiltration and deposition (CVI/CVD) processes. Exemplary embodiments relate to separators that are usable to separate porous preforms that are subject to CVI/CVD processes.

BACKGROUND

Chemical Vapor Infiltration and Deposition (CVI/CVD) is a process in which a material is deposited onto and within a porous structure to form a component. An exemplary application of CVI/CVD technology is in the production of carbon-carbon composite race car and aircraft disc brake rotors. In the production of such exemplary brake discs, preformed porous carbon structures are placed in a furnace and high temperature carbon containing reactant gas is passed through the porous structures. The carbon containing gas mixture flowing around and through the porous preformed structures comprised of carbon fiber material cause dehydrogenation, condensation and polymerization reactions to occur which result in the deposition of carbon atoms within the interior and upon the surface of the porous preforms. With the passage of time more carbon atoms are deposited into the preform structures causing them to become more dense, and eventually the porous preforms become solid parts. This process is sometimes referred to as densification. An exemplary process for producing carbon-carbon composition disc brake rotors is described in U.S. Patent Publication 2006/0046059 A1, the disclosure of which is incorporated herein by reference in its entirety.

The manufacture of carbon-carbon composite disc brake rotors and other products by densification generally requires that separators be positioned between the porous preforms during the densification process. The separators enable the individual parts to be separated from one another after the densification process is complete. Because in many applications the separators must enable carbon carrying gas to reach areas disposed inwardly from the peripheral outer surfaces of the preforms, it is a common problem for separators to become adhered to the parts by the deposited material. This can result in separators sticking to the parts and a requirement for post densification processing steps to remove residual material from the parts.

Separators for preforms may sometimes be comprised of materials such as inconel metal. Such materials for separators are expensive. Further, the adhesion of densified material to the metal separators may require that such separators be ground otherwise treated to remove densified material after each use. This may limit the number of production cycles in which such separators may be used.

These and other drawbacks are associated with existing separators used to separate preforms during CVI/CVD processing. Therefore, CVI/CVD preform separators may benefit from improvements.

SUMMARY

Exemplary embodiments provide CVI/CVD preform separators comprised of a plurality of thin sheet organic fiber layers. The thin sheet fiber layers are adhered through intermediate adhesive layers. In exemplary arrangements the thin sheets may be comprised of organic fibers such as cellulose, polyacrylonitrile (PAN), rayon, or pitch. Exemplary layers including adhesive may include adhesives such as polyvinyl alcohol (PVA), potato starch, corn starch, sugar, epoxy resins, phenolic resins or other suitable adhesives. In some exemplary embodiments carbon fibers or carbon fiber precursors may be integrated with the adhesive to provide additional rigidity to the finished separators.

In exemplary arrangements the separators are produced by carbonization of the body including the plurality of the thin sheets and adhesive layers. In exemplary arrangements the carbonization is carried out under pressure that is applied transversely to flat planar opposed side surfaces of the separator body. Carbonization in exemplary arrangements is carried out in a non-oxidizing atmosphere and at maximum temperatures from about 700-1100° C. In exemplary arrangements the rate of increase in temperature during the carbonization process is controlled so that the temperature increases upwardly from about 2° C. to 50° C. per hour.

In exemplary arrangements during carbonization the body undergoes shrinkage generally in the range of about 25%. During carbonization the exemplary body is held subject to pressure and enabled to move to accommodate such shrinkage while maintaining flat planar opposed side surfaces.

After carbonization of the separator body exemplary embodiments have channels formed in the body. The channels extend from at least one peripheral surface and through each of the flat planar opposed side faces of the body. The exemplary channels enable the flow of carbon carrying gas into the channels and outwardly into preforms in abutting relation with one or both side faces of the separator.

Exemplary embodiments provide generally non-stick separators that reduce or eliminate the undesirable build up of material that causes the separator to stick to the densified preforms after processing. The exemplary separators do not stick to the carbon densified preforms or are readily separated therefrom. Further, exemplary separators may be used multiple times for separating preforms in densification processes without the need for the separators being reworked or replaced. Other beneficial and useful properties of exemplary embodiments will be made apparent in the following detailed description.

BRIEF DESCRIPTION OF DRAWINGS

FIG. 4 is a schematic side view of a portion of a preform separator body including a plurality of thin sheets with layers including adhesive positioned in between.

DETAILED DESCRIPTION

Figure 1:
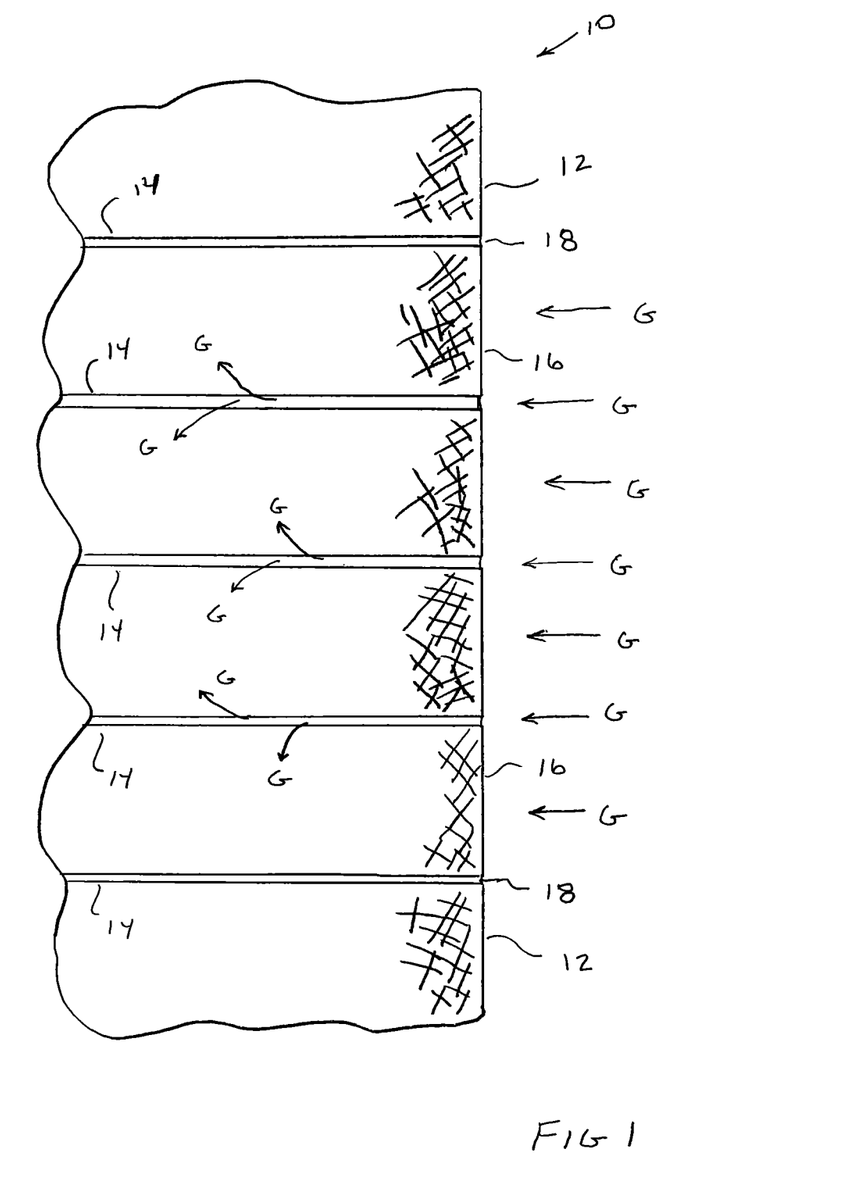
FIG. 1 is a schematic cross-sectional view representing a plurality of stacked CVI/CVD preforms separated by separators and subject to carbon carrying gas during densification.
Figure 2:
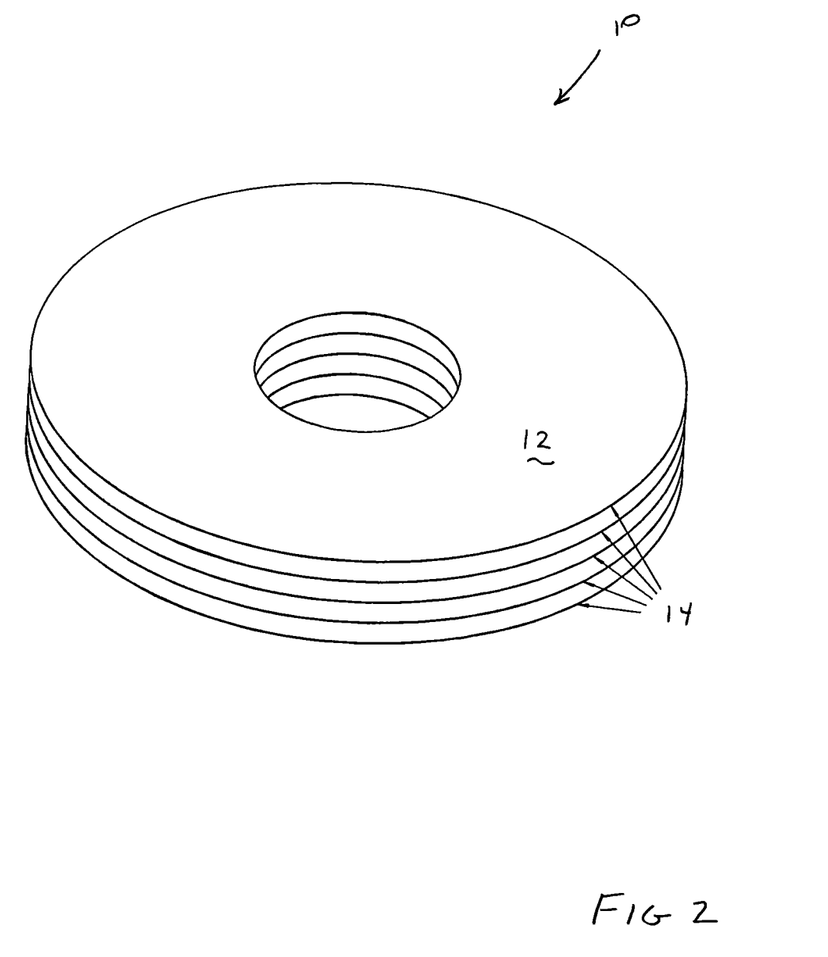
FIG. 2 is a top perspective view of exemplary disc brake rotor preforms such as might be used when producing carbon-carbon composite disc brake rotors.

Referring now to the drawings and particularly to FIG. 1 it is shown therein a schematic side cross sectional view of a stack 10 of CVI/CVD preforms 12. In the exemplary embodiment the preforms 12 are comprised of porous carbon fiber materials which are configured to enable the flow of carbon carrying gas therethrough so as to accomplish densification of the preforms in a manner like that discussed in U.S. Patent Publication 2006/0046059 A1 the disclosure of which is incorporated herein by reference in its entirety. It should be appreciated however, that although the exemplary embodiments of the CVI/CVD preform separators discussed herein are usable in connection with the production of carbon-carbon composite disc brake rotors, the materials and processes described herein may also be used with other types of CVI and/or CVD structures and processes.

In an exemplary embodiment represented in FIG. 1, each of the porous preforms 12 is separated from adjacent preforms by separators 14. Carbon carrying gas represented by arrows G flows through and around the porous preforms to carry out the densification of the preforms. In addition, in exemplary embodiments the carbon carrying gas is enabled to flow through channels in the separators 14 as later discussed, to enable the carbon carrying gas to flow into the preforms on opposed sides of the separator 14 in areas disposed inwardly from the outer periphery 16 of the preforms and the outer periphery 18 of the separators.

Figure 3:
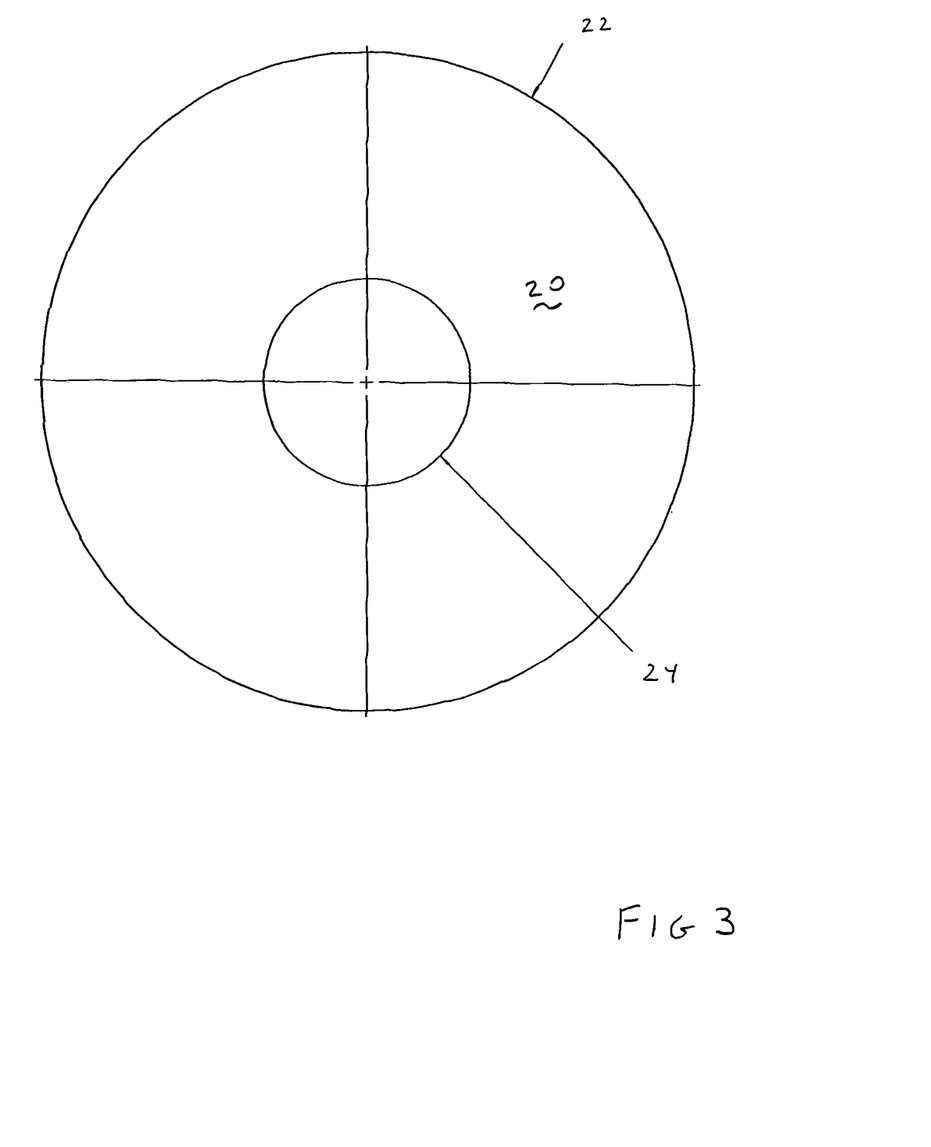
FIG. 3 is a top plan view of an exemplary thin sheet comprised of non-metallic organic fibers used in producing exemplary embodiments of preform separators.

In the exemplary embodiment the preform separators are comprised of a plurality of thin sheets 20. Thin sheets 20 are comprised of high purity organic fibers with virtually no metallic contamination. Exemplary thin sheets 20 are donut shaped, as shown in FIG. 3, and include an external annular surface 22 and an internal annular surface 24. This configuration of the exemplary thin sheets 20 is utilized in connection with CVI/CVD preforms that produce disc brake rotors through densification. It should be understood that other configurations of thin sheets which make up exemplary CVI/CVD preform separators may be utilized for parts that have different configurations.

In the exemplary embodiment the thin sheets are comprised of cellulose material that is about 1 mm in transverse thickness. Such thin sheets comprised of cellulose have a density of about 0.9 g/cm$^3$. Of course, this material and its properties are exemplary. In other embodiments the thin sheets may have thicknesses that vary from about 1 mm to 2 mm in transverse thickness. Further, in other exemplary embodiments the organic fibers may include materials such as polyacrylonitrile (PAN), rayon, pitch fibers or other carbon precursor materials. The exemplary embodiments of thin sheets are generally flat and uniform in thickness. Of course, it should be understood that these materials, dimensions and properties for the thin sheets are exemplary and in other embodiments of other materials, dimensions and properties may be used.

Figure 4:
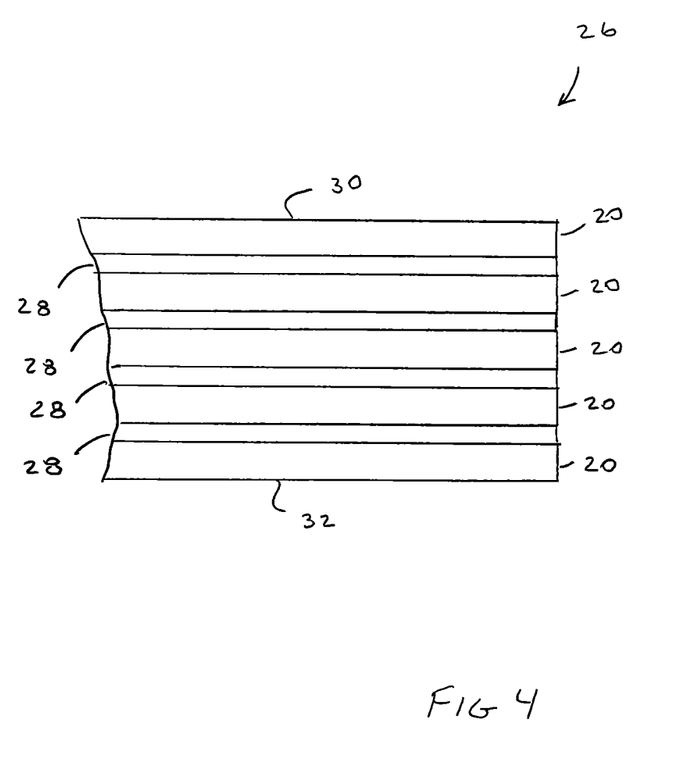

As represented in FIG. 4, the exemplary CVI/CVD preform separators are comprised of a plurality of thin sheets 20 which form a body generally indicated 26. The exemplary body 26, prior to undergoing a carbonization process as later discussed, includes a plurality of stacked thin sheets 20. Extending between each of the adjacent thin sheets 20 are layers 28. Layers 28 include an adhesive. The adhesive is operative to hold the thin sheets of the pre-carbonized body in a laminate type arrangement.

In some exemplary embodiments the assembly of the thin sheets and layers included in the pre-carbonization body 26, includes five thin sheets and four adhesive-containing layers. In other exemplary embodiments different numbers of thin fiber containing sheets and layers intermediate of immediately adjacent thin sheets, may be utilized. For example, in other exemplary preform separators, between three and seven thin sheet layers may be included in the pre-carbonization body. Of course, it should be understood that these arrangements of thin sheets and adhesive-containing layers are exemplary and in other embodiments other arrangements and configurations may be used.

In some exemplary embodiments the layers may include adhesives including polyvinyl alcohol (PVA). In some exemplary arrangements the adhesive included in the layers may include potato starch, corn starch, sugar, epoxy resins, phenolic resins or other organic or inorganic adhesives.

In some exemplary embodiments the adhesive layers are continuous as shown in FIG. 4 and include adhesives uniformly spread which are applied in amounts in a range of about from 0.01 to 0.10 g/cm$^2$ in each layer intermediate of the opposing surfaces of the thin sheets. Of course, the amount of the adhesive included in the layers within this range is exemplary and in other embodiments other amounts of adhesives may be included in the layers, depending on the properties of the adhesive and thin sheets utilized.

In some exemplary embodiments the adhesive layers include therein short milled carbon fibers which increase the flexural strength of separators. In exemplary embodiments the carbon fibers may be produced from carbon precursors such as PAN, pitch and/or rayon. In some exemplary embodiments such carbon fibers may be integrated with the adhesive material so as to comprise between about 5% to 35% by weight of the material included in the adhesive-containing layer. Of course, it should be understood that these approaches are exemplary and other embodiments and other approaches may be used.

Other exemplary preform separators may also include adhesive containing layers with carbon precursor materials such as fibers or fiber batting comprised of PAN, rayon, or other carbon fiber precursors. In some exemplary arrangements, the carbon precursor fibers may have lengths as great as 0.5 inches and longer, depending on the nature of the pre-carbonized assembly and the configuration thereof.

Figure 5:
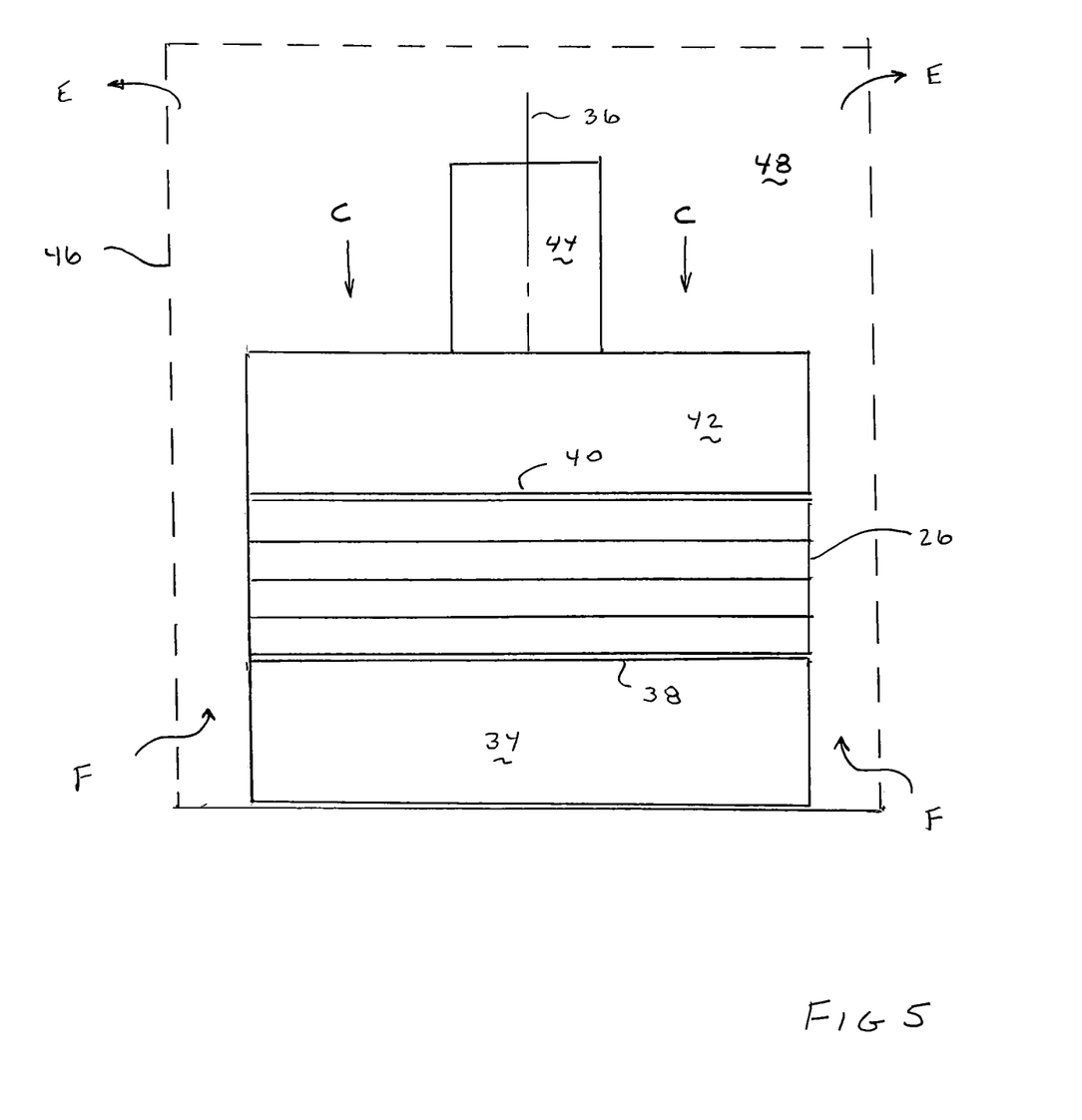
FIG. 5 is a schematic view of an apparatus utilized to carry out carbonization of the exemplary preform separator bodies.

In some exemplary embodiments the CVI/CVD preform separators are produced by subjecting the body 26 to carbonization. An exemplary carbonization process and the apparatus associated therewith is schematically represented in FIG. 5. In an exemplary process the body 26 is formed by assembling the alternative thin sheets 20 and layers containing adhesive and possibly other fibers to form the body 26. As can be appreciated, the body 26 includes a pair of opposed flat planar opposed side faces 30 and 32. In an exemplary arrangement a plurality of the bodies 26 are placed in stacked, aligned relation as shown in FIG. 5. In this exemplary arrangement the bodies 26 are supported at the bottom side on a graphite plate 34. In exemplary embodiments the graphite plate has dimensions that are generally the same diameter as the bodies 26. In exemplary embodiments the plate 34 may be from about 0.25 to 2.0 inches in thickness along a vertical axis 36.

Positioned between the top of the plate 34 and the lowest of the bodies 26 is a sheet of graphite foil 38. In an exemplary embodiment the graphic foil is relatively thin and may be from about 0.008 to 0.060 inches in axial thickness.

Similarly, above the stacked bodies 26 is another sheet of graphite foil 40. Positioned above the sheet of graphite foil is another graphite plate 42 which may be similar to plate 34. In an exemplary embodiment an alignment post 44 extends along the axial direction and through the central openings in the bodies 26 as well as in the plates 34, 42 and sheets 38 and 40. The alignment post may be comprised of graphite or other suitable heat dissipating and spreading materials.

In an exemplary carbonization process the bodies 26 are arranged in a stack which includes at least one body 26. In some exemplary arrangements five or more bodies 26 are arranged in stacked relation between the foil sheets and plates. Of course, these arrangements are exemplary and in other embodiments other approaches may be used.

In an exemplary arrangement the stacked bodies, plates and sheets are positioned in a high temperature retort or similar sealable heated furnace device 46. The exemplary retort 46 includes an interior area 48 that can be selectively heated and wherein the temperature within the interior area 48 can be controlled. Various heating methods may be utilized for purposes of achieving suitably elevated temperatures for carbonization of the bodies 26 within the interior area 48.

The exemplary retort 46 includes a generally sealed chamber for purposes of maintaining a non-oxidizing atmosphere therein. Further, in an exemplary arrangement suitable valving, nozzles and other devices are provided for providing a controlled flow of non-oxidizing gas into the interior area of the retort. In exemplary embodiments the gas utilized may include nitrogen or an inert gas such as argon which is suitable for maintaining the desired non-oxidizing atmosphere at the elevated temperatures which are provided within the interior area of the retort. The incoming gas flow into the retort is represented by the arrows F.

Also, in an exemplary arrangement the retort 46 is provided with suitable outlet openings, valves and other structures so as to enable gases to exit from the interior area of the retort. This is represented by the arrows E in FIG. 5. In exemplary arrangements the retort is enabled to receive the non-oxidizing gas into the interior area and to maintain a flow therethrough during the carbonization process. In some exemplary arrangements the flow may be, for example, relatively low as sufficient to purge the gaseous constituents which are produced in the course of the carbonization process. In some exemplary arrangements the flow may be in the range of 1 to 20 CFM depending on the particular configuration of the retort and the volume thereof. In exemplary arrangements volatiles may be liberated during the carbonization process and the gases which are exhausted from the interior area of the retort may be subject to treatment by thermal oxidation or other appropriate measures before being released to the atmosphere. Of course, these approaches are exemplary and other embodiments and other approaches may be used.

In an exemplary process the bodies 26 are first assembled from the thin sheets and adhesive containing layers and then allowed to cure for a reasonable period of time at room temperature. This generally hardens the adhesive so as to produce a relatively rigid body for purposes of handling and placement in the retort. The bodies 26 are then placed in stacked relation within the retort as shown in FIG. 5, in intermediate relation of the graphite foil sheets 38, 40 and graphite plates 34, 42. In the exemplary arrangement compressive force indicated by the arrows C is applied in the axial direction to the stack of plates and bodies. The force exerts pressure on the plates and the stacked bodies in a direction that is transverse to the side faces of the bodies.

The compression force which produces an oppositely directed force on the bottom of the stacked arrangement, is sufficient to hold the bodies in compression, and abutting engagement during the carbonization process, but is not so great so as to prevent the movement due to shrinkage which occurs during carbonization of the exemplary embodiments. The compressive force may be applied through numerous approaches such as weights or other materials that are sufficient to provide a suitable compressive force.

In the exemplary arrangement the interior area 48 of the retort is heated so as to achieve carbonization of the bodies 26. In exemplary arrangements to achieve carbonization of the bodies 26 the interior area is heated to a temperature of between about 700° C.-1100° C. The carbonization is carried out in the report as previously discussed in a non-oxidizing atmosphere such as in an atmosphere comprised of nitrogen or an inert gas such as argon, which is flowed at a suitable rate through the interior area.

In exemplary arrangements the carbonization process is controlled so as to assure that the carbonized bodies that are produced are enabled to undergo movement due to shrinkage without producing waves or other non-planar contours in the opposed side faces of the bodies. In an exemplary arrangement the temperature within the interior area of the retort is increased gradually. This helps to minimize risk of producing separators that have irregular side face surfaces and contours. In an exemplary arrangement the temperature within the interior area is elevated at a gradually increasing rate. This gradually increasing rate may, in some arrangements, be from about 2° C. per hour to about 50° C. per hour.

In the exemplary arrangement the reactions that occur within the retort during the carbonization of the bodies are exothermic reactions. The graphite foil sheets 38 and 40 operate to provide lubrication and heat dissipation for the adjacent body. Each of the graphite plates serve as a heat sink for absorbing the heat that results from the exothermic reactions that occur as the bodies 26 undergo carbonization. In the exemplary embodiments the bodies undergo shrinkage in all directions generally in the range of about 25% during carbonization. The graphic foil layers, in combination with the graphite plate heat sinks, help to assure that the adjacent bodies are enabled to move during shrinkage without resulting in non-uniform contours. In addition, the pressure force helps to assure that upon completion of the carbonization process, each of the bodies have opposed flat planar side faces. Of course, it should be understood that the process steps described are exemplary, and in other embodiments and other approaches may be used.

Upon the completion of the carbonization process the bodies each have a pair of flat planar opposed side faces and an annular periphery on the outside of the body. Likewise, each body has an inner periphery that extends between the side faces in the area of the central opening. The carbonized bodies of the exemplary arrangements are also reduced in thickness as a result of the carbonization process by approximately 25%. Of course, as can be appreciated, the final thickness of the carbonized discs can be controlled based on the initial thickness of the body and the number of thin sheets and layers included therein prior to carbonization.

Figure 6:
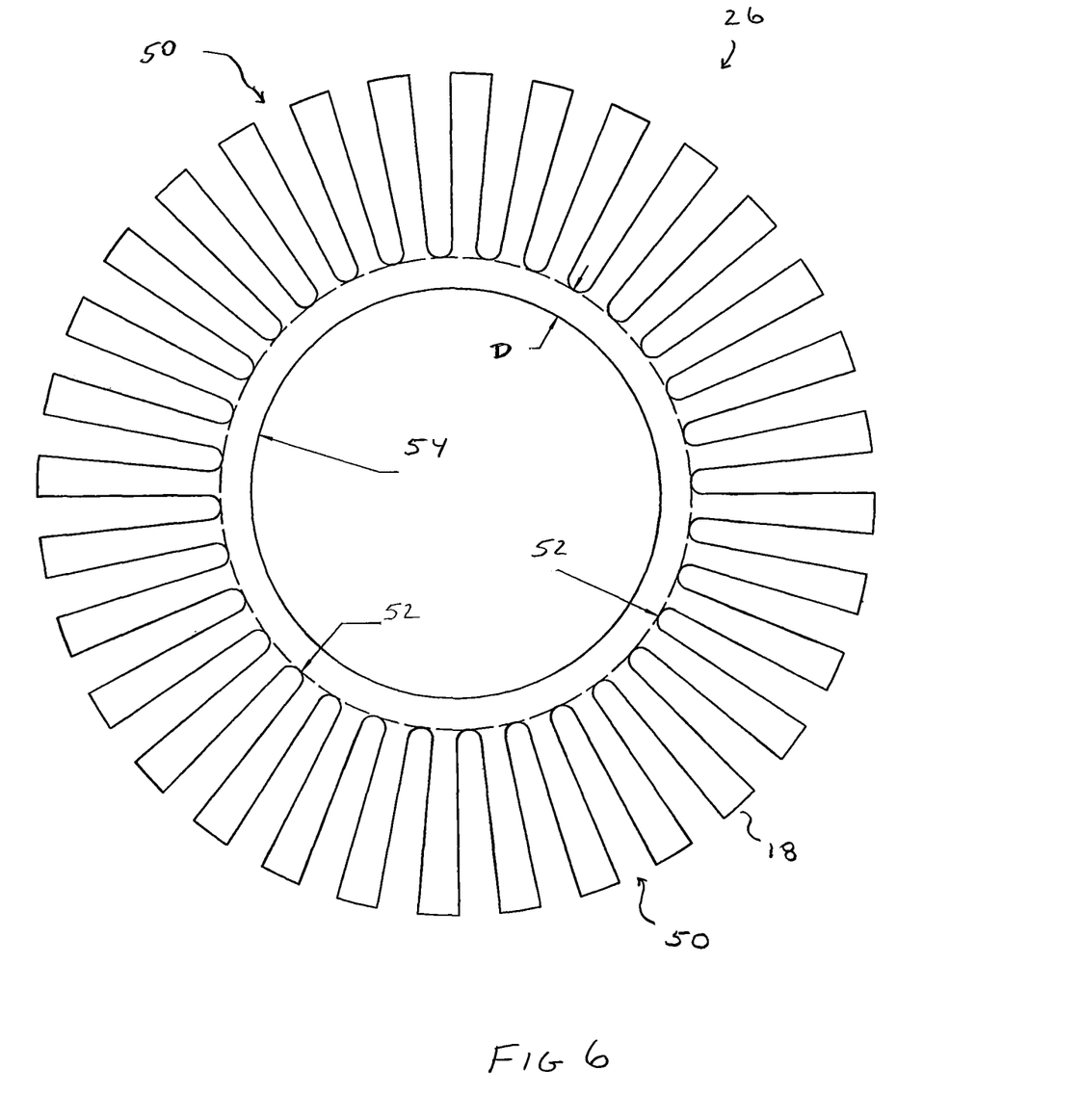
FIG. 6 is a top plan view of an exemplary CVI/CVD preform separator that has undergone a post carbonization process to form radially extending channels therein.
Figure 7:
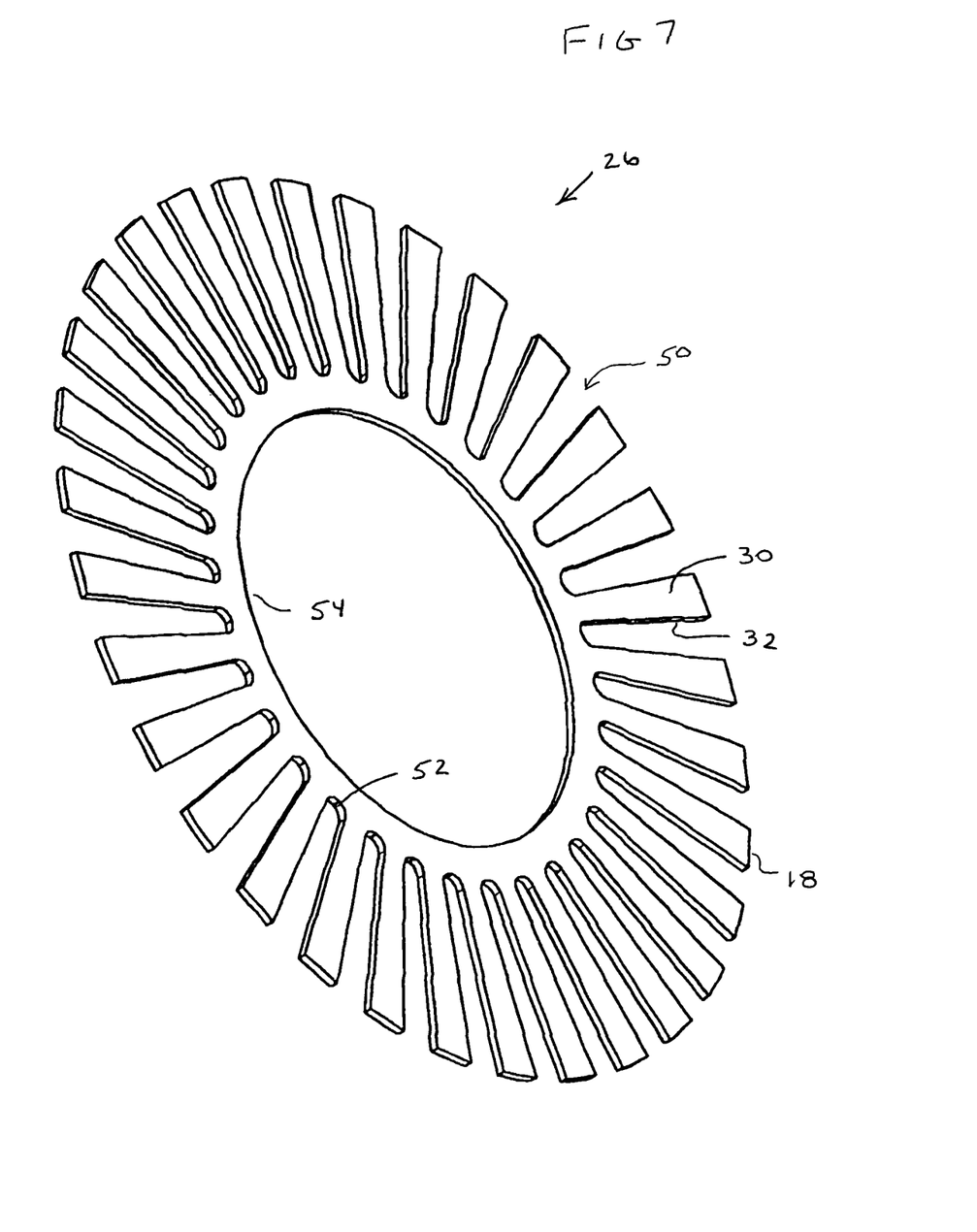
FIG. 7 is a perspective view of the preform separator shown in FIG. 6.

In an exemplary arrangement a plurality of channels are then formed in the carbonized disc bodies. In exemplary arrangements channels are formed so as to enable the flow of the carbon carrying gas during the densification process from the outer periphery, radially toward the center of the body. In exemplary arrangements a plurality of channels 50 are formed to extend radially inward from the periphery 18 of the separator body. In the exemplary arrangement the channels are formed so as to enable the gas flow sufficiently radially inwardly so as to accomplish densification within the entire annular body of the preform.

In exemplary embodiments the channels are formed by processes such as milling, water jet cutting, laser cutting, plasma cutting, knife edge cutting, stamping or other suitable forming methods. As can be appreciated, forming methods are controlled so as to maintain a suitable solid radial thickness D of the carbonized body so as to maintain the integrity thereof. Also, as can be appreciated in exemplary arrangements the channels 50 extend inwardly to radiused fillets 52 or other structures so as to avoid sharp corners that might result in a high stress location that produces a crack or other irregularity. Of course, it should be understood that the configuration shown in FIGS. 6 and 7 is an exemplary one for use with densification of preform structures such as disc brake rotors, and for other types of products other types and configurations of separator configurations and channel configurations may be utilized.

For example, in other embodiments the separators may be configured so as to include channels that extend from an inner periphery 54. This may be done for example, in situations where the carbon carrying gas is directed to migrate and flow through the porous preforms radially outward rather than radially inward as in the exemplary embodiment. Further, it should be appreciated that in other arrangements or for other structures, different channel configurations may be formed so as to assure that densification occurs in the proper locations of the part being formed.

It should also be appreciated that while in the exemplary arrangement the channels are formed after the bodies have been carbonized, in other arrangements the channels may be formed in the bodies prior to carbonization. In the exemplary arrangement the channels are configured so that the carbon carrying gas may flow radially inwardly into each respective channel from the outer periphery 18, and then transversely from the channel into an adjacent preform in abutting relation with the side face above or below the separator. In other arrangements however, the separator structures may be configured so as to enable passage of the gas in only one transverse direction rather than both. The particular configuration will depend on the part being formed and the areas in which densification is required to occur.

The exemplary CVI/CVD preform separators provide advantages in that they are low in cost while providing a relatively longer useful life. For example, in some exemplary arrangements in the manufacture of disc brake rotors, preform separators may be used for from 5 to 10 production cycles before they begin to deform and/or attract the carbon material to the point where the separator is no longer usable. Further, the exemplary preform separators are also non-stick which makes the completed parts more readily separable and avoids post densification processing costs. Thus, the exemplary embodiments provide improved production capabilities and reduced costs compared to some other CVI/CVD preform separators.

Exemplary arrangements using the carbonized body structures comprised of thin sheets of organic fibers and layers including adhesives and other materials that are then carbonized, may be used for other types of devices and processes as well. For example, formed structures comprised of such carbonized materials may be utilized as sinter plates in the formation of powdered and metal parts. Likewise, such bodies may be configured for use as sinter plates in the production of carbide parts.

Formed materials created using the exemplary processes and materials may also be used for bodies that are utilized in glass handling, and for welding fixtures and welding blankets. In addition, such structures produced in accordance with the exemplary processes may be utilized for producing heat insulators, fire barriers, furnace insulation or welding fixtures. Numerous different applications for the materials and processes described will be apparent to those having skill in the art.

Although arrangements have been described herein based on certain exemplary embodiments, a wide array of modifications, variations and alternative constructions and configurations are also within the spirit and scope of the principles described herein. It will also be readily understood that the features and properties of the exemplary embodiments as described and illustrated, can be arranged and designed in a wide array of different configurations. That is, features, structures and/or characteristics of the arrangements described herein may be combined in any suitable manner in other embodiments or arrangements. The detailed description of the exemplary embodiments and the described articles and methods are not intended to limit the scope of the embodiments as claimed, but are merely representative of selected exemplary embodiments that implement the principles described herein.

In the forgoing description certain terms have been used to describe example arrangements for purposes of brevity, clarity and understanding. However, no unnecessary limitations are to be implied therefrom because such terms have been used for descriptive purposes and are intended to be broadly construed. Such terms shall not be construed as limitations on the scope of the claims hereof. Moreover, the descriptions and illustrations therein are by way of examples and the inventive teachings are not limited to the specific details that have been shown and described.

The exemplary structures, arrangements and methodologies achieve at least some desirable objectives, eliminate difficulties encountered in the use of prior articles and methods, solve problems and attain the desirable results described herein.

In the following claims any feature described as a means for performing a function shall be construed as encompassing any means to those having skill in the art as being capable of performing the recited function and shall not be deemed limited to the particular means used for performing the function that is shown in the foregoing description or mere equivalents thereof.

Having described the features, discoveries and principles of the exemplary embodiments, the manner in which they are constructed and operated, and the advantages and useful results attained; the new and useful structures, devices, elements, arrangements, parts, combinations, systems, equipment, operations, methods, processes and relationships are set forth in the appended claims.

I claim:

1. An article comprising
a CVI/CVD preform separator, including:
a body,
wherein the body includes
a plurality of thin sheets comprised of organic fibers,
a plurality of continuous layers including an adhesive, wherein each layer extends between two immediately adjacent sheets,
wherein the sheets and layers are carbonized after assembly,
the body after carbonization including
a pair of flat planar opposed side faces,
a periphery extending transversely between the opposed side faces, a plurality of channels, wherein each of the channels extend from the periphery and through each of the pair of side faces,
wherein each of the channels is configured to enable carbon carrying gas flow therethrough from the periphery and out of the respective channel into a respective CVI/CVD preform in abutting relation with a respective side face.

2. The article according to claim 1, wherein
each of the thin sheets has a pre-carbonization thickness of about 1 mm and is comprised of cellulose,
the adhesive in each of the layers comprises polyvinyl alcohol (PVA),
each of the channels comprises a post-body carbonization formed channel.

3. The article according to claim 1
wherein the adhesive in each of the layers comprises at least one of
polyvinyl alcohol (PVA),
sugar,
potato starch,
corn starch,
epoxy resin, and
phenolic resin.

4. The article according to claim 1
wherein each of the thin sheets includes fibers comprised of at least one of
cellulose,
polyacrylonitrile (PAN),
rayon,
pitch.

5. The article according to claim 1
wherein each of the layers includes carbon fibers integrated with the adhesive.

6. The article according to claim 1
wherein each of the layers includes carbon fibers integrated with the adhesive,
wherein the carbon fibers are produced from a precursor including PAN, rayon, or pitch,
wherein the carbon fibers comprise 5 to 35% of each layer by weight prior to carbonization.

7. The article according to claim 1
wherein each thin sheet is about 1 mm to about 2 mm thick prior to carbonization.

8. The article according to claim 1
wherein each layer includes adhesive uniformly spread therein in a range of about 0.01 g/cm$^2$ to about 0.10 g/cm$^2$.

9. The article according to claim 1
wherein at least one of the channels comprises a post-carbonization formed channel.

10. The article according to claim 1
wherein each of the channels comprises a post-carbonization formed channel that comprises at least one of,
a milled cut channel,
a water jet cut channel,
laser cut channel,
plasma cut channel,
knife edge cut channel, and
a stamping cut channel.

11. The article according to claim 1
wherein the body has an outer periphery, and wherein each of the plurality of channels extends inwardly from the outer periphery.

12. The article according to claim 1
wherein the body is disc-shaped, and wherein the body has an outer annular periphery,
wherein the plurality of channels extend radially inwardly from the outer periphery.

13. The article according to claim 1
wherein the body comprises 3 to 7 thin sheets,
wherein each of the thin sheets are about 1 mm thick prior to carbonization, and are comprised of cellulose, and
wherein each of the layers include an adhesive comprising polyvinyl alcohol (PVA).

14. The article according to claim 1
wherein the body comprises the thin sheets and layers post-carbonized in a non-oxidizing atmosphere to a maximum temperature of about 700 to about 1100° C.

15. The article according to claim 1
wherein the body comprises the thin sheets and layers post-carbonized in a non-oxidizing atmosphere to a maximum temperature of about 700 to about 1100° C., with the maximum temperature being achieved by gradual increase at a rate not exceeding about 50° C. per hour.

16. The article according to claim 1
wherein the body comprises the thin sheets and layers post-carbonized in a non-oxidizing atmosphere to a maximum temperature of about 700 to about 1100° C., and with the body being held under pressure force applied transversely to the planar opposed side surfaces during carbonization.

17. The article according to claim 1
wherein the body comprises the thin sheets and layers post-carbonized in a non-oxidizing atmosphere to a maximum temperature of about 700 to about 1100° C., and with the body being held under pressure force applied transversely to each of the flat planar opposed side faces during carbonization with allowed shrinkage movement of the body without creation of non-flat opposed side faces.

18. The article according to claim 1
wherein at least one layer of the plurality of layers includes carbon fiber precursors integrated with the adhesive prior to carbonization.

19. The article according to claim 1
wherein the body is a disc-shaped body that comprises 5 to 7 disc shaped thin sheets, wherein each of the sheets includes at least one of
cellulose,
polyacrylonitrile (PAN),
rayon, and
pitch,
wherein each sheet is about 1 mm to about 2 mm in thickness prior to carbonization,
wherein each layer includes an adhesive including at least one of
polyvinyl alcohol (PVA),
sugar,
potato starch,
corn starch,
epoxy resin,
phenolic resin, and
at least one of
carbon fibers,
a carbon fiber precursor,
integrated into the adhesive,
wherein the body includes the thin sheets and the layers after carbonization in a non-oxidizing atmosphere to a maximum temperature of about 700 to about 1100° C. with a gradual rate of increase in temperature limited to not greater than about 50° C. per hour, and with pressure force applied transversely to the pair of flat planar opposed side faces with allowed shrinkage movement during carbonization without creation of non flat planar opposed side faces,
wherein each of the plurality of channels comprises a channel formed after carbonization
that comprises at least one of
a milled cut channel,
water jet cut channel,
laser cut channel,
plasma cut channel,
knife edge cut channel, and
a stamp cut channel,
that extends radially inward from the outer periphery of the disc-shaped body.

20. The article according to claim 1
wherein each of the channels enables the carbon carrying gas flow therethrough into the respective abutting CVI/CVD preform which undergoes carbon densification, at temperatures from 950° C. to 1100° C. and at pressures from 5 torr to 40 torr, without carbon from the carbon carrying gas attaching to the body of the CVI/CVD preform separator to cause the CVI/CVD preform separator to adhere to the respective abutting CVI/CVD preform.

21. The article according to claim 1
wherein each of the channels enables the carbon carrying gas flow therethrough into the respective abutting CVI/CVD preform which undergoes carbon densification, at temperatures from 950° C. to 1100° C. and at pressures from 5 torr to 40 torr, without the CVI/CVD preform separator adhering to the densified preform.

22. An article comprising:
a CVI/CVD preform separator, including:
a carbonized body,
wherein the carbonized body includes
a plurality of thin sheets comprised of carbonized organic fibers,
a plurality of continuous layers including a carbonized adhesive, wherein each layer extends between two immediately adjacent sheets,
a pair of flat planar opposed side faces, wherein each of the side faces extends parallel to each of the sheets,
a periphery extending transversely between the opposed side faces,
a plurality of channels, wherein each of the channels extends from the periphery and transversely through each of the pair of side faces,
wherein each of the channels enables carbon carrying gas flow therethrough from the periphery and out of the respective channel into a respective CVI/CVD preform in abutting relation with a respective side face.

23. The article according to claim 22
wherein each of the channels enables the carbon carrying gas flow therethrough into the respective abutting CVI/CVD preform which undergoes carbon densification, at temperatures from 950° C. to 1100° C. and at pressures from 5 torr to 40 torr, without carbon from the carbon carrying gas attaching to the body of the CVI/CVD preform separator and without the CVI/CVD preform separator adhering to the densified preform.

24. A method comprising
making a CVI/CVD preform separator including
producing a body by
a) providing a pre-carbonized body, wherein the pre-carbonized body includes a plurality of thin sheets comprised of organic fibers and intermediate continuous layers including adhesive between each pair of immediately adjacent thin sheets, to produce a pre-carbonized body,
b) carbonizing the pre-carbonized body of (a), wherein after carbonization the carbonized body includes a pair of flat planar opposed side faces and a periphery that extends transversely between the opposed side faces,
c) forming a plurality of channels in the carbonized body of (b) that extend from the periphery through each of the side faces, wherein each of the channels enables carbon carrying gas flow therethrough from the periphery and out of the respective channel into a respective CVI/CVD preform in abutting relation with a respective side face.

25. The method according to claim 24
wherein (b) includes
heating the pre-carbonized body from about 700 to about 1100° C. in a non-oxidizing atmosphere while during at least a portion of such heating applying pressure force transversely to the pre-carbonized body to produce the carbonized body having a pair of flat planar opposed side faces.

26. The method according to claim 25
wherein in (a)
the body includes a disc-shaped body that comprises 5 to 7 disc shaped thin sheets, wherein each of the sheets includes at least one of
cellulose,
polyacrylonitrile (PAN),
rayon, and
pitch,
wherein each sheet is about 1 mm to about 2 mm in thickness prior to carbonization,
wherein each layer includes an adhesive including at least one of
polyvinyl alcohol (PVA),
sugar,
potato starch,
corn starch,
epoxy resin,
phenolic resin, and
at least one of
carbon fibers,
a carbon fiber precursor,
integrated into the adhesive,
wherein in (b)
carbonization is carried out in a non-oxidizing atmosphere to a maximum temperature from about 700 to about 1100° C. with a gradual rate of increase in temperature limited to not greater than about 50° C. per hour,
with pressure force applied transversely to the pair of flat planar opposed side faces that allows shrinkage movement during carbonization without causing non flat planar opposed side faces,
wherein in (c)
the plurality of channels
are formed in the body after carbonization through at least one of
milling,
water jet cutting,
laser cutting,
plasma cutting,
knife edge cutting, and
stamping,
and wherein each of the plurality of channels extend radially inward from the outer periphery of the disc-shaped body.

27. The method according to claim 24 wherein in (c) each of the channels enables the carbon carrying gas flow therethrough into the respective abutting CVI/CVD preform which undergoes carbon densification, at temperatures from 950° C. to 1100° C. and at pressures from 5 torr to 40 torr, without carbon from the carbon carrying gas attaching to the body of the CVI/CVD preform separator and without the CVI/CVD preform separator adhering to the densified preform.

* * * * *